Figure 1:
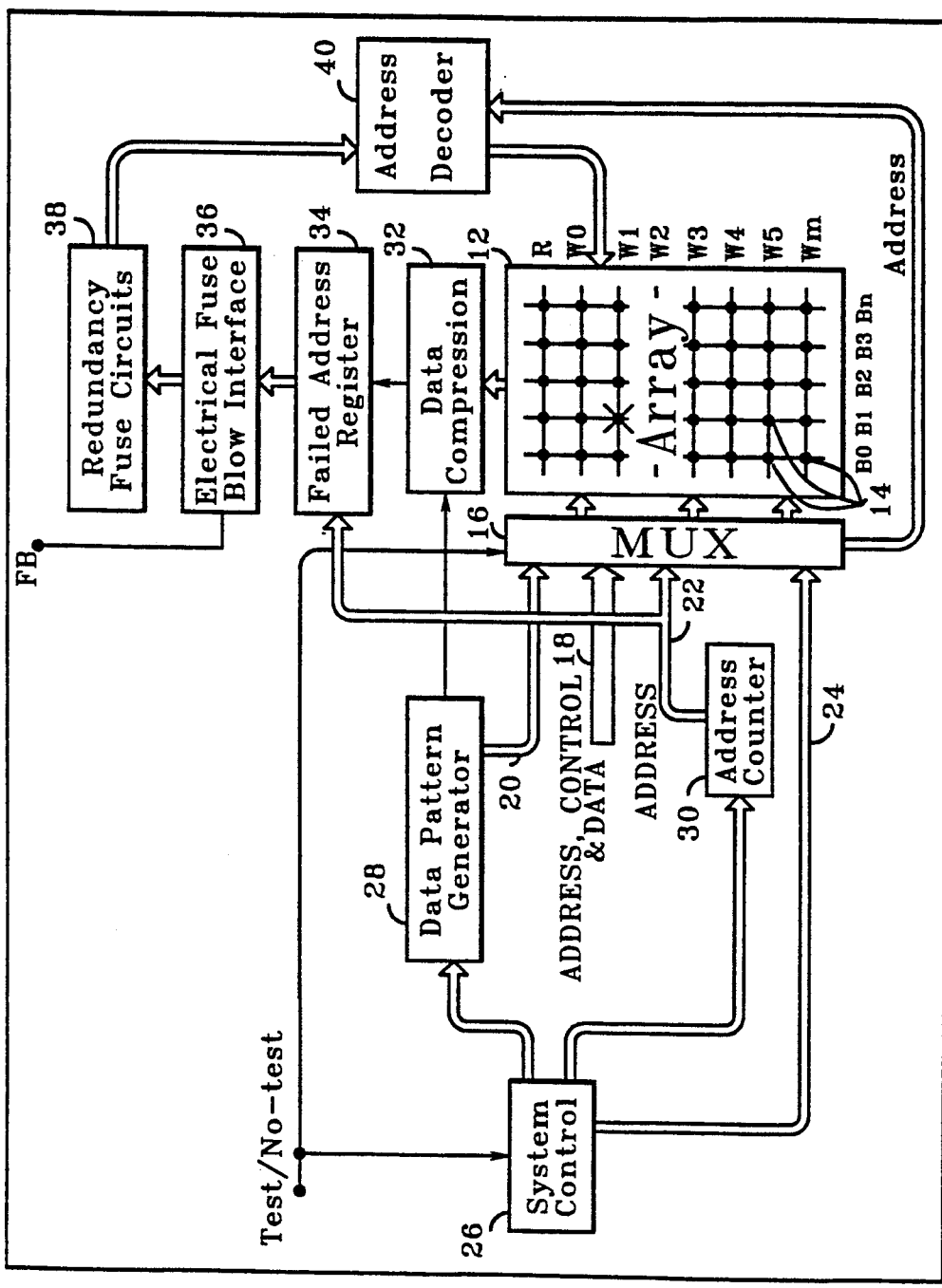

United States Patent [19]
Adams et al.

[11] Patent Number: 5,313,424
[45] Date of Patent: May 17, 1994

[54] MODULE LEVEL ELECTRONIC REDUNDANCY

[75] Inventors: Robert D. Adams, Essex Junction; Henry A. Bonges, III, Milton, both of Vt.; James W. Dawson, Poughkeepsie, N.Y.; Erik L. Hedberg, Essex Junction, Vt.

[73] Assignee: International Business Machines Corporation, Armonk, N.Y.

[21] Appl. No.: 852,587

[22] Filed: Mar. 17, 1992

[51] Int. Cl.$^5$ ............................................. G11C 13/00
[52] U.S. Cl. ...................... 365/200; 365/96; 365/201; 365/210
[58] Field of Search ............... 365/200, 210, 201, 96

[56] References Cited

U.S. PATENT DOCUMENTS

| | | | |
|---|---|---|---|
| 3,560,764 | 2/1971 | McDowell | 365/154 |
| 3,585,607 | 6/1971 | De Haan et al. | 365/154 |
| 3,755,791 | 8/1973 | Arzubi | 340/173 R |
| 4,939,694 | 7/1990 | Eaton et al. | 365/200 |

OTHER PUBLICATIONS

European Patent Application 0 242 854, published Oct. 28, 1987. IBM Technical Disclosure Bulletin, vol. 23, No. 8, pp. 3601 and 3602, entitled "Semiconductor Memory Redundancy at Module Level" by B. F. Fitzgerald et al.
U.S. patent application Ser. No. 07/576,646, filed Aug. 30, 1990, by E. L. Hedberg et al, entitled "Built-In Self Test for Integrated Circuits".
U.S. patent application Ser. No. 07/777,877, filed Oct. 16, 1991, by E. L. Hedberg et al, entitled "Method & Apparatus for Real Time Two Dimensional Red.Allocation".
U.S. patent application Ser. No. 07/693,463, field Apr. 30, 1991, by W. Abadeer et al, entitled "Low Voltage Programmable Storage Element".
"A Physical Mechanism of Current-Induced Resistance Decrease In Heavily Doped Polysilicon Resistors", *IEEE Transactions on Electron Devices,* vol. ED-29, No. 8, Aug. 1982, pp. 1156 to 1161, by K. Kato et al.

*Primary Examiner*—Terrell W. Fears
*Attorney, Agent, or Firm*—Stephen J. Limanek; Mark F. Chadurjian

[57] ABSTRACT

A redundancy system formed on a semiconductor chip is provided which includes circuits for testing a memory array to locate a faulty element therein, a register for storing an address of the faulty element and electrical fuses blown in response to binary digits of the address stored in the register upon application of an enable signal from a single input to the semiconductor chip. The enable signal passes through logic circuits on the chip such that the fuses cannot be programmed or blown unless the enable signal is present. An address decoder coupled to outputs from the fuses substitutes a redundant element for the faulty element.

10 Claims, 4 Drawing Sheets

MODULE LEVEL ELECTRONIC REDUNDANCY

TECHNICAL FIELD

This invention relates to an array built in self test (ABIST) system which provides for memory testing and replacement of failed elements in an array after module assembly.

BACKGROUND ART

Replacement of failed elements or lines in a memory array formed on a chip or substrate by the use of redundant elements or lines provided on the chip or substrate has been known. Redundancy techniques have generally used laser beams to blow fuses formed on a substrate at wafer levels. In this manner redundant elements are used to replace failing elements. Thereafter the wafer is diced into chips and the chips are mounted in a module. After completion of the module burn-in takes place. Any elements that fail burn-in are discarded or undergo disassembly of the module and expensive repairs.

A chip that integrates various kinds of circuits including logic circuits having memory arrays embedded therein poses special problems for circuit designers/testers who desire adequate testability of the embedded arrays since such chips have fewer input/output pins available to the circuit testers than is available in a chip having a stand alone memory.

To lower the cost of making memories by reducing testing expenses and improving memory yields, systems have been disclosed which are self testing and self repairing. One such system, sometimes known as an array built in self test (ABIST) system, is taught in U.S. Pat. No. 4,939,694, issued on Jul. 30, 1990, which uses substitute address tables and error correction code (ECC) techniques for correcting errors found in the memory cell. Another ABIST system, disclosed in European Patent No. 0 242 854, published on Oct. 28, 1987, replaces defective memory cells of a semiconductor memory with spare memory cells using an associative memory. U.S. Pat. No. 3,755,791, issued on Aug. 28, 1973, filed by L. M. Arzubi, and IBM Technical Disclosure Bulletin, Vol. 23, No. 8, pp. 3601 and 3602, entitled "Semiconductor Memory Redundancy at Module Level" by B. F. Fitzgerald and D. R. Whittaker, disclose the use of non-volatile cells for storing failing addresses semi-permanently. A further ABIST system is disclosed in U.S. patent application entitled "Built-In Self Test for Integrated Circuits" and having Ser. No. 07/576646, filed on Aug. 30, 1990, by E. L. Hedberg et al., wherein one dimensional failed address registers are used to store word addresses of defective cells of a memory array, i.e., redundant lines are provided which extend in only one direction parallel to the word lines of the array. U.S. patent application entitled "Method and Apparatus for Real Time Two Dimensional Redundancy Allocation" filed on Oct. 16, 1991, by E. L. Hedberg and G. S. Koch, having Ser. No. 07/777,877, discloses an ABIST system wherein two dimensional redundant lines are directly allocated in real time during final manufacturing testing to increase semiconductor chip yields U.S. patent application entitled "Low Voltage Programmable Storage Element", filed on Apr. 30, 1991, having Ser. No. 07/693,463, discloses programmable redundancy wherein resistance decreases in a programmable antifuse circuit are sensed.

Disclosure of the Invention

It is an object of this invention is to provide an improved array built in self testing system on a semiconductor chip wherein testing and replacement of faulty elements in an array occurs after the chip on which the array has been formed has been packaged in a module.

In accordance with the teachings of this invention, an improved array built in self test system is provided on a semiconductor chip which includes means for storing an address of a faulty element of an array, an electrical fuse having a first end thereof coupled to a first terminal of a supply voltage and means responsive to an enabling signal and to the address stored in the storing means for selectively coupling a second end of the fuse to a second terminal of the supply voltage to switch input signals representative of the address of the faulty element to signals representative of a redundant line.

The foregoing and other objects, features and advantages of the invention will be apparent from the following more particular description of the preferred embodiments of the invention, as illustrated in the accompanying drawings.

BRIEF DESCRIPTION OF THE INVENTION

Figure 2:
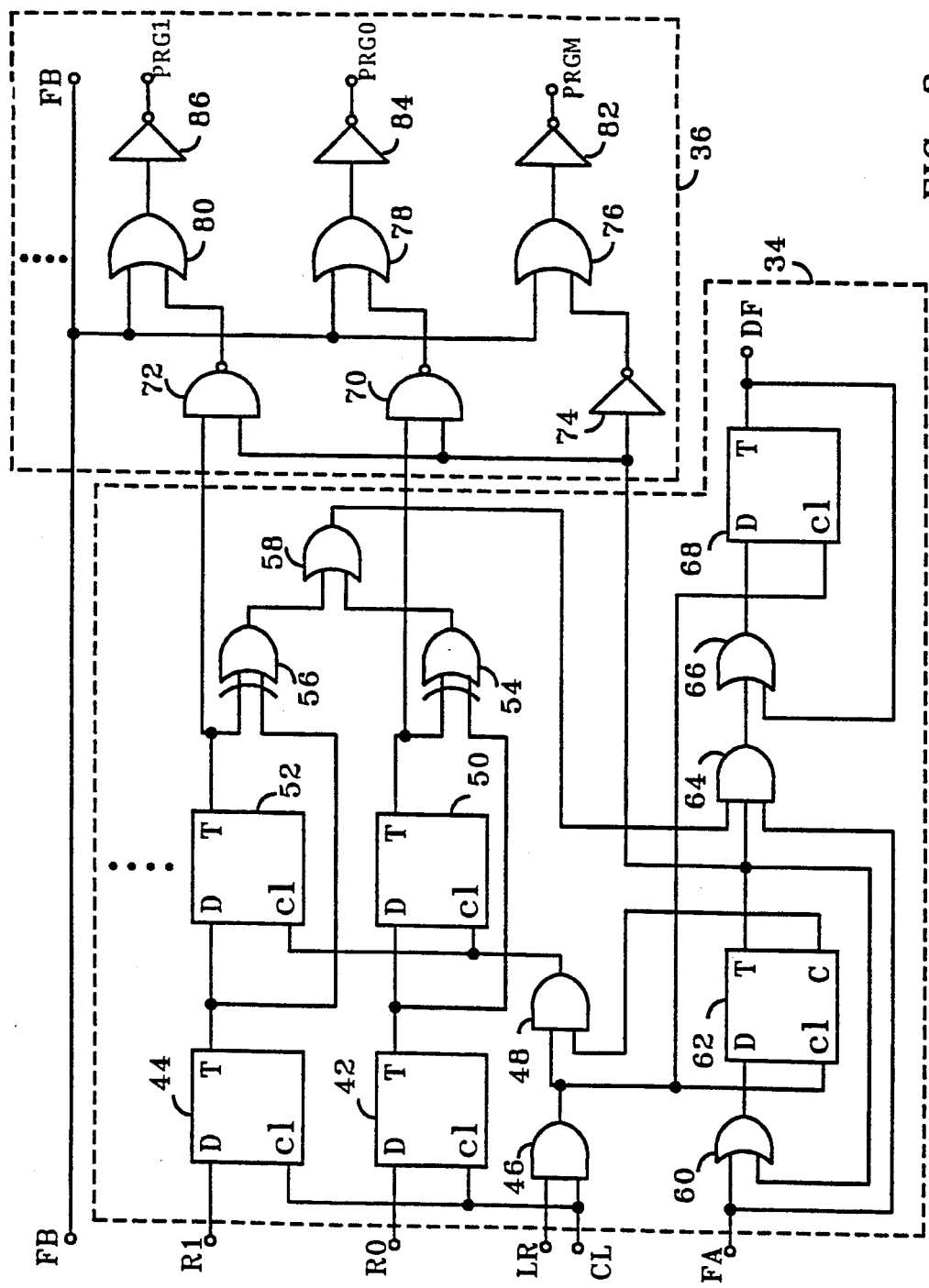
Figure 3:
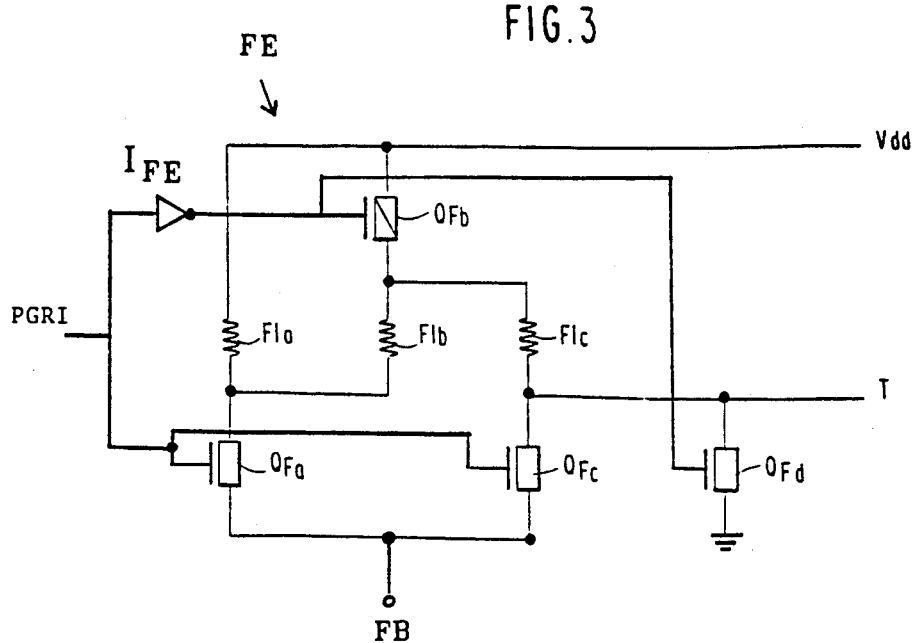
Figure 4:
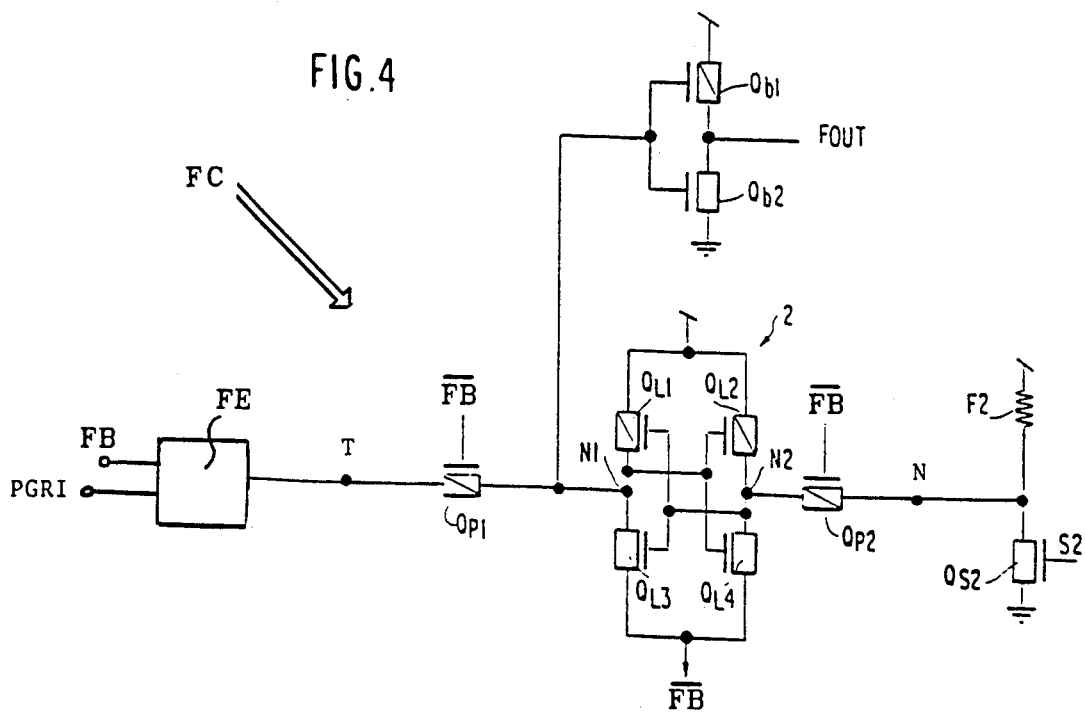
Figure 5:
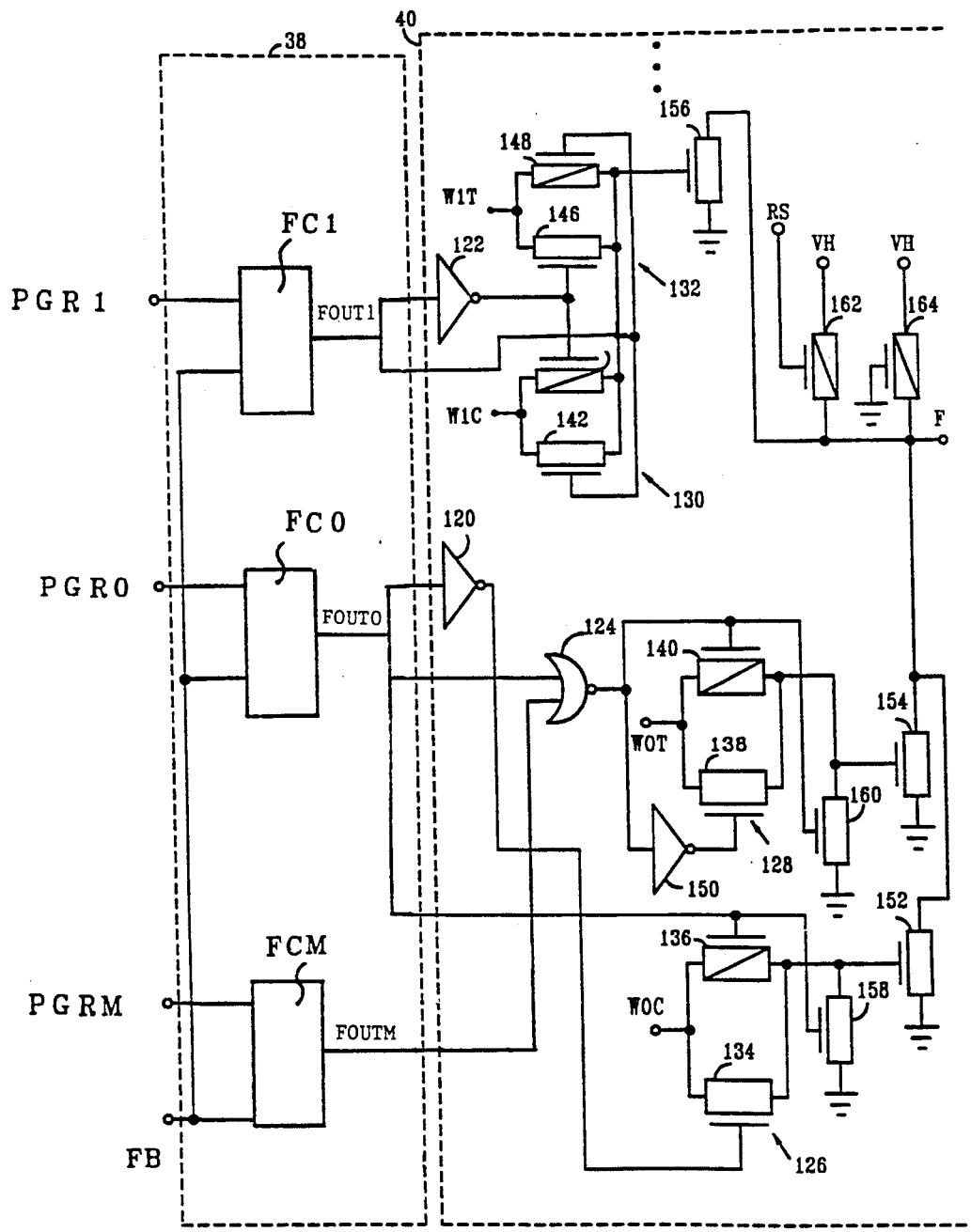

FIG. 1 is primarily a block diagram of an array built in test (ABIST) system of the present invention, FIG. 2 is a circuit diagram illustrating in more detail failed address register and electrical fuse blow circuits indicated in the ABIST system shown in FIG. 1 of the drawings, FIG. 3 is a circuit diagram of a fuse element FE of the invention, FIG. 4 is a circuit diagram of the fuse circuit FC of the invention, which utilizes element FE of FIG. 3, and FIG. 5 is a circuit diagram illustrating in more detail redundancy fuse circuits and some of the circuits of the address decoder indicated in the ABIST system shown in FIG. 1 of the drawings.

BEST MODE FOR CARRYING OUT THE INVENTION

Referring to FIG. 1 of the drawings in more detail, there is illustrated primarily in block form an array built in self test (ABIST) system of the present invention which shows the main functional elements of the system formed on a semiconductor chip 10, which may be made of silicon. The chip 10 includes a memory array 12 having a plurality of horizontally arranged word lines W0, W1, W2, W3, W4, W5 and Wm and a plurality of vertically arranged bit lines B0, B1, B2, B3 and Bn, and a horizontally arranged redundant word line R disposed adjacent to the word line W0. If desired, the number of word lines may be equal to 256, thus m being equal to 255, and the number of bit lines may be equal to 128, thus n being equal to 127. Also, more than one redundant line may be provided on he chip 10. Each of the word lines W0 to Wm and the bit lines B0 to Bn includes a plurality of memory cells located at the intersections of the word lines W0 to Wm and B0 to Bn, identified in FIG. 1 by dots 14. As will be explained hereinbelow, these cells are tested by the ABIST system of the present invention and unacceptable or failed cells are identified as to address locations in the array and replaced by a redundant line. An unacceptable or failed cell is identified in the array 12 of FIG. 1 by an X, with the remaining cells 14 being useful or good cells. A good memory cell is a cell which is capable of carrying out its intended data storage function without error, while a faulty memory cell does not function as intended, causing data error. It should be understood that the word lines W0 to Wm, the bit lines B0 to Bn and the redundant line R include known driver and sense amplifier circuits for writing information into and reading information out of the cells 14, and that the array 12 may be either a static random access memory (SRAM) or a dynamic random access memory (DRAM).

As indicated in FIG. 1 of the drawings, self test circuits interface with the array 12 through a multiplexer or MUX 16, which generally includes a receiver, under the control of a signal from a test/no-test terminal, multiplexing between address, control and data inputs 18 and test inputs 20, 22 and 24, with signals provided to the address, control and data inputs 18 generally being provided from sources off the chip 10, or from prior logic circuits on chip. A test or system control circuit 26 is provided to control a data pattern generator 28 and an address counter 30 which generate the test data and address data, respectively, for the self testing of the memory array 12 through the multiplexer 16. The test data is written into the memory cells 14 of the array 12 located on the chip 10 and then read out to a data compression unit 32, as is known, where it is compared with the test data written into the cells 14 from the data pattern generator 28. As is also known, the results of the comparison are reduced to a single pass/fail, fault/no fault or master fail signal. These results are applied to a failed address register 34 which may include one or more latches, preferably of the shift register (SRL) type, and which also receives word addresses of the cells 14 of the array 12.

The system control circuit 26 provides per address read/write commands to the array 12, controls address stepping, influences data pattern generation to the array 12 and to the data compression circuit 32 and controls result logging in the failed address register 34. During a read operation, expected data from the data pattern generator 28 is applied to the data compression circuit 32 for data output evaluation. This exercise continues until a maximum address flag is issued by the address counter 30 to the system control circuit 26 for providing a new test sequence. Three operational phases are pipelined in the ABIST system to sufficiently test any address cell in the array 12. During a first phase, array input data is being set up for the next phase which includes applying the data and address signals to the inputs 20, 22 and 24 of the multiplexer 16. Then during the next phase, the actual data is read out of the array 12, compared in the data compression circuit 32 and the pass/fail or master fail signal provided to the fail address register 34. During the last phase, the pass/fail or master fail signal is used to log in or store a word address of a failed cell of the array 12, such as the address of the failed cell of the array 12 indicated at the intersection of word line W1 and the bit line B1, in the fail address register 34.

After the array has been fully tested and a word address has been stored in the failed address register 34, indicating the presence of a faulty cell in the array 12, an electrical fuse blow interface circuit 36 is activated in response to binary address signals from the failed address register 34 and a fuse blow enabling signal from a terminal FB. The terminal FB is a pad or pin on the chip 10 to which the enabling signal is applied from an off chip source after all tests of the array are completed. Redundancy fuse circuits 38 including a plurality of fuses, coupled to the outputs of the electrical fuse blow interface circuits 36, are selectively blown depending upon the binary address signals stored in the failed address register 34. Outputs from the redundancy fuse circuits 38 are coupled to a suitable address decoder 40 of any known type so as to switch the input address of the defective word line to the redundant word line R. Accordingly, it can be seen that by using only one pad or pin FB on the chip 10, the memory array can be tested and a redundant word line can be substituted for a defective word line even after the chip 10 has been encapsulated or packaged in module form. Thus, it should be noted that modules that fail after burn-in, which is a significant number, can be repaired and fully used by the practice of the present invention.

FIG. 2 is a circuit diagram in accordance with the teachings of this invention which illustrates in more detail the fail address register 34 and the electrical fuse blow interface circuit 36 shown in FIG. 1 of the drawings. The fail address register 34 of FIG. 2, indicated within dashed lines, includes a first latch 42 having a true output T and a data input D connected to an address terminal R0, and a second latch 44 having a clock input cl, a true output T and a data input D connected to an address terminal R1. A first AND circuit 46 has a first input connected to a clock terminal CL, which provides clock pulses for the shift register latches (SRL) used in the system of the present invention, and a second input connected to a load result terminal LR, which has a high voltage applied thereto during the testing operation in response to the signals applied to the test/no test terminal indicated in FIG. 1 of the drawings. Clock inputs cl in latches 42 and 44 are connected directly to the clock terminal CL. A second AND circuit 48 has a first input connected to an output of the first AND circuit 46. A third latch 50 has a clock input cl connected to an output of the second AND circuit 48, a data input D connected to the true output T of the first latch 42 and a true output T, and a fourth latch 52 has a clock input cl connected to the output of the second AND circuit 48, a data input connected to the true output T of the second latch 44 and a true output T. A first EXCLUSIVE-OR circuit 54 has a first input connected to the true output T of the third latch 50 and a second input connected to the true output T of the first latch 42, and a second EXCLUSIVE-OR circuit 56 has a first input connected to the true output T of the fourth latch 52 and a second input connected to the true output T of the second latch 44. A first OR circuit 58 has a first input connected to an output of the second EXCLUSIVE-OR circuit 56 and a second input connected to an output of the first EXCLUSIVE-OR circuit 54.

A second OR circuit 60 has a first input connected to a pass/fail or master fail terminal FA which is coupled to the output of the data compression circuit 32 shown in FIG. 1 of the drawings. A fifth latch 62 has a data input D connected to an output of the second OR circuit 60, a clock input cl connected to the output of the first AND circuit 46, a true output T connected to a second input of the second OR circuit 60 and a complement output C connected to a second input of the second AND circuit 48. A third AND circuit 64 has a first input connected to an output of the first OR circuit 58, a second input connected to the true output T of the fifth latch 62 and a third input connected to the master fail terminal FA. A third OR circuit 66 has a first input connected to an output of the third AND circuit 64, and a sixth latch 68 has a data input D connected to an output of the third OR circuit 66, a clock input cl connected to the output of the first AND circuit 46 and a true output T connected to a second input of the third OR circuit 66 and to an overflow terminal DF.

The electrical fuse blow interface circuit 36 shown in FIG. 1 of the drawings is illustrated in more detail within the dashed lines 36 in FIG. 2. The electrical fuse blow interface circuit 36 includes a first NAND circuit 70 having a first input connected to the true output T of the third latch 50 and a second input connected to the true output of the fifth latch 62, and a second NAND circuit 72 having a first input connected to the true output T of the fourth latch 52 and a second input connected to the true output of the fifth latch 62. A first inverter 74 also has an input connected to the true output T of the fifth latch 62. A fourth OR circuit 76 has a first input connected to the fuse blow enable signal terminal FB, also shown in FIG. 1 of the drawings, and a second input connected to an output of the first inverter 74, a fifth OR circuit 78 has a first input connected to the fuse blow enable signal terminal FB and a second input connected to an output of the first NAND circuit 70 and a sixth OR circuit 80 has a first input connected to the fuse blow enable signal terminal FB and a second input connected to the output of the second NAND circuit 72.

The electrical fuse blow interface circuit 36 also includes a second inverter 82 having an input connected to an output of the fourth OR circuit 76, a third inverter 84 having an input connected to an output of the fifth OR circuit 78 and a fourth inverter 86 having an input connected to an output of the sixth OR circuit 80. Of course, as is known, if desired, the combination of the OR circuits 76, 78 and 80 and the inverters 82, 84 and 86 may be simplified by forming NOR circuits. As will be described in more detail below, the respective PRGM, PRG0, PRG1 outputs of the inverters 82, 84, 86 are used in conjunction with the FB signal to program the fuse elements.

As stated previously, the invention utilizes electrically "blowable" fuses. As a practical matter any electrically blowable element could be used. In the invention, the element should "blow" by application of a voltage of four volts and a current on the order of 1 mA. This is because substantially higher voltages on-chip will induce dielectric breakdown, latchup, and other deleterious FET failure mechanisms. In the invention it is preferred to use an unsilicided, doped polysilicon line as a fuse element. Upon application of a given current density, the poly line exhibits a discrete decrease in resistance. See an article by Kato et al, "A Physical Mechanism of Current-Induced Resistance Decrease in Heavily Doped Polysilicon Resistors," *IEEE Transactions on Electron Devices*, Vol. ED-29, No. 8, Aug. 1982 pp. 1156-61. This phenomena has been used previously to construct an electrically blowable fuse element. See U.S. patent application Ser. No. 07/693,463 by W. Abadeer et al, entitled "Low Voltage Programmable Storage Element," the teachings of which are incorporated herein by reference. The invention utilizes a modified version of the fuse disclosed in the Abadeer et al. patent application. These modifications will be described in more detail below.

The programmable fuse element FE utilized in the present invention is shown in FIG. 3 and comprises a polysilicion line F1 having three discrete parts F1a, F1b and F1c coupled to a supply voltage source $V_{dd}$, and output terminal T and a fuse blow voltage source FB by a plurality of switching transistors $Q_{Fa}$, $Q_{Fc}$ receives a control signal PRGI at their respective gate electrodes, and transistors $Q_{Fb}$ and $Q_{Fd}$ receive the inverse of PRGI through inverter $I_{FE}$. Preferably, each of the resistors F1a through F1c is formed from an unsilicided polysilicon conductor strip and have equal resistances. For example, when the total series resistance of the programmable antifuse circuit F1 is 2000 ohms, each of the resistors has an individual resistance of about 670 ohms. Preferably, the dopant of the unsilicided polysilicon conductor is phosphorous, boron or arsenic.

When sensing the programming state of the resistors F1a-F1c, transistors $Q_{Fa}$, $Q_{Fb}$ and $Q_{Fc}$ are off while transistor $Q_{Fd}$ is on. It will be appreciated that in this first condition, resistors F1a, F1b and F1c are connected in series between $V_{dd}$ and terminal T. $Q_{Fd}$ advantageously is turned on to limit current through resistors F1a-F1c to less than the threshold current needed to "blow" the resistors. It will be apparent that, when resistors F1a-F1c provide sufficient series resistance to significantly limit the current through the series connected resistors, the transistor $Q_{Fd}$ can be omitted, allowing transistors $Q_{Fc}$ to control current during both sensing and programming. During programming of antifuse F1, control signals are applied to turn on transistors $Q_{Fa}$-$A_{Fc}$, thus coupling resistors F1a-F1c in parallel and producing a current greater than the threshold current in each of the resistors F1a-F1c.

As disclosed in the Kato et al. reference, discussed above, the resistance of a polysilicon conductor having Na, Nd dopant concentrations greater than $10^{20}/cm^3$, when subject to a current density J of at least $1.0 \times 10^6$ A/cm² over a period of about 0.5 µsec, will exhibit a resistance decrease up to about 50 percent due to dopant redistribution. The resistance change is non-volatile and non-destructive unless the conductor is again subjected to a current density greater than J or a period of time longer than 0.5 µsec. Assuming the polysilicon conductor has cross section dimensions of $0.3 \times 10^{-4}$ cm and $0.35 \times 10^{-4}$ cm, in an exemplary case, a threshold current $I_{TH}$ of 1.05 mA would provide the required value of J. In another exemplary case, where the series resistance of F1 is 2000 ohms and fuse element cross section is 350 nanometers by 600 nanometers, the threshold current $I_{TH}$ would be at least 5.0 mA, thus requiring an applied voltage of at least 10 V. It will be appreciated that the required voltage is too high to be applied to the entire chip. Resistors F1a-F1c, when coupled in parallel by transistors $Q_{Fa}$-$Q_{Fc}$, permit the required current density to be achieved with a significantly lower applied voltage. In the example where 10 V is applied to produce the required threshold current $I_{TH}$, an equivalent current density advantageously can be achieved in parallel resistors F1a-F1c with an applied voltage of about 4 V, instead of the previously required 10 V.

The programmable fuse element FE of FIG. 3 is used as part of a programmable fuse circuit FC shown in FIG. 4 which comprises a plurality of transistors $Q_{L1}$ through $Q_{L4}$ operatively connected to form a sensing latch 2 having nodes N1 and N2, and elements FE and F2 operatively coupled to nodes N1 and N2, respectively, via corresponding ones of transistors $Q_{P1}$ and $Q_{P2}$. F2 can be a single polysilicon element having the equivalent series resistance equivalent to the three portions F1a, F1b, F1c of F1 prior to fuse blow. Transistor $Q_{Fd}$ in FIG. 3 draws the same current through F1a-F1c as does device Qs2 through F2, to convert a resistance difference between F1 and F2 into a voltage difference between node T (output of FE) and node N. Sensing latch 2 advantageously amplifies the voltage difference between nodes T and N upon activation of the pass transistors QP1 and QP2 as well as the pulldown of the set node by FB. Preferably, the final state of sensing latch 2 is indicative of the fuse element having the higher resistance. One of the nodes N1 and N2 is connected to an output terminal $F_{out}$ via an inverter formed from a pair of transistors $Q_{b1}$ and $Q_{b2}$, which buffer the sensing latch 2 output. For the programmable storage element FE shown in FIG. 3, a signal at $F_{out}$ is equal to voltage $V_{dd}$ when the resistance of F1 is greater than the resistance of F2, while the signal at $F_{out}$ is equal to ground potential GND when the resistance values of F1 and F2 are reversed.

The redundancy fuse circuits FC indicated in FIG. 4 of the drawings are utilized as the programmable elements FCM, FC0, FC1 as illustrated in FIG. 5 within the dashed lines 38. When FB is lowered, any one of the fuse circuits that have their respective PGR signal high will be programmed, as previously described with reference to FIGS. 3-5.

As set forth hereinabove in connection with the description of the block diagram in FIG. 1, the address decoder 40 may be of a known type. However, in order to more clearly disclose the present invention a portion of the circuit diagram of the address decoder 40 is illustrated in FIG. 5 within the dashed lines 40. The decoder 40 includes an inverter 120 having an input connected to the output Fout0 of FC0, and an inverter 122 having an input connected to the output Fout1 of FC1. A NOR circuit 124 has a first input connected to the output FoutM of FCM and a second input connected to an output Fout0 of FC0. A first passgate 126, a second passgate 128, a third passgate 130 and a fourth passgate 132 each include an N-channel field effect transistor connected in parallel with a P-channel field effect transistor. The first passgate 126 includes an N-channel transistor 134 and a P-channel transistor 136 connected at a first end to an address terminal W0C, the second passgate 128 includes an N-channel transistor 138 and a P-channel transistor 140 connected at a first end to an address terminal W0T, the third passgate 130 includes an N-channel transistor 142 and a P-channel transistor 144 connected at a first end to an address terminal W1C and the fourth passgate 132 includes an N-channel transistor 146 and a P-channel transistor 148 connected to an address terminal W1T. A control electrode of the N-channel transistor 134 is connected to an output of the inverter 120, a control electrode of the P-channel transistor 136 is connected to the Fout0 output, the control electrode of the N-channel transistor 138 is coupled to an output of the NOR circuit 124 through a inverter 150, the control electrode of the P-channel transistor 140 is connected directly to the output of the NOR circuit 124, the control electrode of the N-channel transistor 142 and the control electrode of the P-channel transistor 148 are connected to an output of the tenth inverter 122 and the control electrode of the P-channel transistor 144 and the control electrode of the N-channel transistor 146 are connected to the Fout1 output. Transistors 152, 154 and 156 are connected in parallel between a common output terminal F and ground, with a control electrode of the transistor 152 being connected to a second end of the passgate 126, a control electrode of the transistor 154 being connected to a second end of the passgate 128 and a control electrode of the transistor 156 being connected to a second end of each of the passgates 130 and 132. A transistor 158 is connected between the control electrode of the transistor 152 and ground with a control electrode connected to the Fout0 output, and a transistor 160 is connected between the control electrode of the transistor 154 and ground with a control electrode connected to the output of the NOR circuit 124. Transistors 162 and 164 are connected in parallel between the voltage supply source VH and the common output terminal F, with a control electrode of the transistor 162 being connected to a reset terminal RS and a control electrode of the transistor 164 being connected to ground. Each of the transistors 152 through 160 is an N-channel field effect transistor, with the transistors 162 and 164 being P-channel field effect transistors.

In the operation of the ABIST system of the present invention it can be seen from FIG. 1 that during test the addresses and particularly the word addresses are applied to the failed address register 34 with the data compression circuit 32 applying a pass/fail or master fail signal to the failed address register 34. This can be seen in more detail by referring to FIG. 2 of the drawings wherein the word addresses are applied to the terminals R0 and R1 and the pass/fail or master fail signal is applied to the terminal FA. The word addresses from the terminals R0 and R1 are applied to the data input D of the latches 42 and 44, respectively, which effectively form a first register, and then are applied from the true output T of the latches 42 and 44 to the data input terminal D of the latches 50 and 52, which form a second register. If a given address is not identified by the master fail signal, e.g., a binary 1 representing a fail and a binary 0 a pass, at the terminal FA as having a failed cell, the address is clocked through the latches 50 and 52, which are preferably of the shift register (SRL) type, from the true outputs T to the first inputs of the EXCLUSIVE-OR circuits 54 and 56. A subsequent word address which is located in the latches 42 and 44 is simultaneously applied to the second inputs of the EXCLUSIVE-OR circuits 54 and 56. It can be seen that if any of the binary digits of the two addresses differ, a binary 1 or a high voltage of, e.g., 3.6 volts will appear at the output of at least one of the EXCLUSIVE-OR circuits. The binary 1 signal is then passed through the OR circuit 58 and applied to the AND circuit 64. However, if there is no indication at the master fail terminal FA that the word line of this word address has a faulty cell, the binary 1 signal does not pass through the AND circuit 64 which also has an input connected to the master terminal FA.

When the word address of a faulty cell, such as cell W1,B1 in the word line W1 of the array 12, indicated in FIG. 1 of the drawings, is being applied to the latches 50 and 52, a binary 1 or high voltage appears simultaneously at the terminal FA. This high voltage passes through the OR circuit 60 to the data input D of the latch 62. Since the latches, including latch 62 are initially set, by, e.g., a known Level-Sensitive Scan Design (LSSD) technique, so that the true outputs are low and the complement outputs are high, the high voltage applied to the data input D of the latch 62 causes the true output to go high and the complement output to go low. With the complement output C of the latch 62 being low, clock pulses from the clock terminal CL can no longer pass through the AND circuit 48 to the latches 50 and 52 in which the faulty word address is located.

Thus, the faulty word address for word line W1 is stored in the latches 50 and 52 throughout the entire testing procedure.

If the word address of a second faulty cell which does not have the same word address as that of the first faulty cell W1,B1 is applied to the data inputs D of the latches 50 and 52 one or more of the EXCLUSIVE-OR circuits 54 and 56 will have a high output which will be applied to the AND circuit 64 through the OR circuit 58. Since the voltage at the true output of the latch 62 is high and since the voltage at the master fail terminal FA is now high, a high voltage will appear at the output of the AND circuit 64 to cause the true output T of the latch 68 to go high, indicating at the overflow terminal DF that the array 12 has too many word lines with faulty cells to be repaired, since in this embodiment of the invention only one redundant word line R has been provided.

If after the testing procedure has been completed and only one faulty word line, W1, has been identified, a low voltage, e.g., 0 volts, is provided at the fuse blow enable signal terminal FB which is applied to the electrical fuse blow interface circuit 36, as seen in some detail in FIG. 2 of the drawings. It should be noted that the high voltage at the true output T of the latch 62 is applied to each of the second inputs of the NAND circuits 70 and 72 of the electrical fuse blow interface circuit 36 and that the first input of the NAND circuits 70 and 72 are connected to the true output T of the latches 50 and 52, respectively, in which the address of the faulty word line W1 is stored. Thus, it can be seen that a binary 0 of the word address stored in the latches, e.g., in latch 52, produces a high voltage at the output of the NAND circuit 72. With a high voltage at the output of the NAND circuit 72, a low voltage is provided at the PRG1 output. Likewise it can be seen that a binary 1 or high voltage at the true output of one of the latches, e.g., latch 50, provides a low voltage at the output of the NAND circuit 70 resulting in a high voltage at the PRG0 output.

The electrical fuse blow interface circuit 36 also has a high voltage applied to the input of the inverter 74 from the true output T of the latch 62 providing a low voltage at the second input of the OR circuit 76, along with the low voltage provided to the first input of the OR circuit 76 from the fuse blow enabling signal terminal FB, resulting in a high voltage at the PRGM output.

Turning to FIG. 3 of the drawings, it can be seen that with the PGR1 input at 1 and FB low, all three elements F1a, F1b, F1c are connected directly to the voltage supply source Vdd or VH and designed to blow with the full supply voltage applied across it, the fuse elements blow to set output T at a high voltage. This causes the latch 2 of FIG. 4 to set node N1 high (the pass devices $Q_{P1}$, $Q_{P2}$ as well as the set node being activated by FB), causing Fout to go low. Thus, in FIG. 5, with PGRO and PGRM high, the Fout0 and FoutM outputs will be permanently maintained at 0 volts. For FC1, with PRG1 low the fuse elements F1a, F1b, F1c will not change, such that node N1 will set low and Fout1 will be permanently set at a high voltage.

With Fout1 at a high voltage, the passgate 130 of the address decoder 40 is turned on, whereas the passgate 132 is turned off. Applied to the terminals W1T and W1C are true and complement address signals produced by a receiver disposed in the MUX 16 and fed to the address decoder 40 through address lines in a well known manner. If the true address is high and the complement is low the transistor 156 will not turn on. With the terminal FOUT0 at a low voltage, the passgate 126 turned off. With the terminal FOUTM low, along with a low voltage at the terminal FOUT0, passgate 128 is turned on. Accordingly, it can be seen that if there is a match between the addresses and the fuses, i.e., if the fuse is not blown and the corresponding true address is high or if the fuse is blown and the corresponding true address is low, none of the transistors 152, 154 and 156 will turn on and thus the terminal F will remain high as reset before each cycle. The transistor 164 merely acts as a bleeder resistor to prevent discharge of the terminal F until at least one of the transistors 152, 154 or 156 is turned on. When terminal F remains high after the test, the address decoder 40 substitutes the redundant word line R for the defective word line W1 in a known manner. If any one of the transistors 152, 154 or 156 is turned on, the terminal F is discharged to ground indicating that the array 12 does not need redundancy substitution for this address. It should be noted that the fuse links in the circuits of the present invention are either open or closed, thus effectively storing binary digits of 1 or 0.

Although only one redundant word line was illustrated in the figures of the drawings, it should be understood that two or more redundant lines may be used in accordance with the teachings of this invention by providing additional registers for storing the faulty addresses along with appropriate additional latches to hold the faulty addresses in these additional registers. Furthermore, two or more memory arrays or subarrays each having one or more redundant lines on a single chip may utilize the teachings of this invention by providing a sufficient number of registers and holding latches along with appropriate array selection logic circuits.

Illustrated in the drawings, in, e.g., the fail address register 34 in FIG. 2, are only two terminals R0 and R1 for receiving the binary bits of the word line addresses. It should be understood, however, that additional address terminals, e.g., a total of eight, depending on the number of word lines used in the array, indicated by a series of dots, may be provided with corresponding latches and logic circuits coupled thereto. In a typical currently used memory array, 256 word lines and 128 bit lines are used which would require word addresses with eight binary digits applied in parallel to eight address terminals in the fail address register 34.

Accordingly, it can be seen that in accordance with the teachings of this invention, an ABIST system is used to identify and store faulty array lines and then to substitute a redundant line for the identified faulty array line by merely toggling the voltage at one pad or pin on the semiconductor chip carrying the memory array. Since the substitution of the redundant line for the faulty array line requires only a change in voltage at one pad or pin of the chip, array testing and redundancy may be carried out after burn-in or even in the field after the chip has been packaged in module form. Since burn-in often uncovers a weak or faulty cell in an array, the use of this invention, employing an electronic redundancy technique, can dramatically increase the yield of a high performance product having a memory array embedded therein. In some products it has been found that 50 to 60% of the burn-in fails could be repaired by using the teachings of the present invention.

While the invention has been particularly shown and described with reference to preferred embodiments thereof, it will be understood by those skilled in the art that various changes in form and details may be made therein without departing from the spirit and scope of the invention.

What is claimed is:

1. An array built in self test (ABIST) system formed on a single semiconductor chip having a pad disposed thereon comprising
    a memory array including a plurality of word lines, one of which is fault, and a redundant word line,
    means coupled to said memory array for providing a first signal to identify said faulty word line,
    failed address register means responsive to said first signal for storing an address of said faulty word line,
    electrical fuse blow interface circuit means responsive to a second signal applied to said pad and coupled to said failed address register means,
    redundancy fuse circuit means including outputs and a plurality of fuses coupled to said electrical fuse blow interface circuit means for blowing selected one or more of said plurality of fuses depending upon the address of said faulty word line stored in said failed address register means, and
    decoding means coupled to the outputs of said redundancy fuse circuit means for replacing said faulty word line with said redundant word line.

2. An array built in self test (ABIST) system as set forth in claim 1 wherein each of the fuses of said plurality of fuses is made of doped polysilicon.

3. An array built in self test (ABIST) system formed on a semiconductor chip and having a power supply source of a given voltage comprising
    a memory array including a plurality of word lines, one of which is faulty, and a redundant word line,
    data compression means coupled to said memory array for providing a first signal to identify said faulty word line,
    failed address register means responsive to said first signal for storing a multi-bit address of said faulty word line,
    redundancy fuse circuit means including a plurality of fuses coupled to said power supply source,
    electrical fuse blow interface circuit means coupling the bits of said multi-bit address to said redundancy fuse circuit means,
    enabling signal means coupled to said electrical fuse blow interface circuit means for connecting selected ones of said plurality of fuses to said power supply source depending upon the multi-bit address of said fault word line stored in said failed address register means, and
    switching means coupled to outputs of said redundancy fuse circuit means for replacing said faulty word line with said redundant word line.

4. An array built in self (ABIST) system as set forth in claim 3 wherein said enabling signal means includes a terminal on said semiconductor chip having an enabling signal applied thereto.

5. An array built in self test (ABIST) system as set forth in claim 4 wherein said terminal is a pin disposed on said semiconductor chip.

6. An array built in self test (ABIST) system as set forth in claim 3 wherein said switching means includes an address decoder.

7. An array built in self test (ABIST) system formed on a semiconductor chip having a pad disposed thereon comprising
    a memory array including a plurality of word lines, one of which is a faulty word line, and a redundant word line,
    data compression means for providing a signal to identify said faulty word line,
    failed address register means responsive to said signal for storing an address of said faulty word line,
    electrical fuse blow interface means responsive to said signal applied to said pad,
    redundancy fuse circuit means including a plurality of fuses coupled to outputs of said electrical fuse blow interface means for blowing selected fuses of said plurality of fuses depending upon the address of said faulty word line, and
    address decoder means coupled to said redundancy fuse circuit means for substituting said redundant word line for said faulty word line.

8. An array built in self test (ABIST) system as set forth in claim 7 wherein each of said fuses is made of doped polysilicon.

9. An array built in self test (ABIST) system formed on a semiconductor chip and having a power supply source of a given voltage comprising
    a memory array including a plurality of word lines, one of which is faulty, and a redundant word line,
    means for identifying said faulty word line, said identifying means including an output having a master fail signal thereon,
    means for storing a multi-bit address of said faulty word line,
    a plurality of fuses, each being selectively coupled to said power supply source,
    interface circuit means coupling respective ones of the bits of said multi-bit address to respective ones of said plurality of fuses, said interface circuit means including at least one NAND circuit having first and second inputs and an output and an OR circuit having first and second inputs and an output, the first input of said NAND circuit being connected to said storing means, the second input of said NAND circuit being coupled to the output of said identifying means, the first input of said OR circuit being connected to the terminal of said enabling signal means, the second input of said OR circuit being connected to the output of said NAND circuit and the output of said OR circuit being coupled to the second end of said plurality of fuses,
    enabling signal means coupled to said interface circuit means for connecting selected ones of said plurality of fuses to said power supply source depending upon the address of said faulty word line stored in said address storing means, said enabling signal means including a terminal on said semiconductor chip having an enabling signal applied thereto, and
    switching means coupled to outputs of said interface circuit means for replacing said faulty word line with said redundant word line.

10. An array built in self address (ABIST) system as set forth in claim 9 wherein said interface circuit means further includes an inverter having an input and an output disposed between the output of said OR circuit and the second end of said plurality of fuses and an N-channel field effect transistor having a control electrode connected between the terminal of said enabling signal means and the second end of said plurality of fuses, the input of said inverter being connected to the output of said OR circuit and the output of said inverter being connected to the control electrode of said transistor.

* * * * *